United States Patent
Ko et al.

(10) Patent No.: US 7,420,382 B2
(45) Date of Patent: Sep. 2, 2008

(54) APPARATUS AND METHOD FOR TESTING SEMICONDUCTOR CHIP

(75) Inventors: Jun-Young Ko, Chungcheongnam-do (KR); Seok-Young Yoon, Chungcheongnam-do (KR); Hyeck-Jin Jeong, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 165 days.

(21) Appl. No.: 11/274,703

(22) Filed: Nov. 14, 2005

(65) Prior Publication Data
US 2006/0119375 A1 Jun. 8, 2006

(30) Foreign Application Priority Data
Dec. 8, 2004 (KR) ............... 10-2004-0103096

(51) Int. Cl.
*G01R 31/02* (2006.01)
(52) U.S. Cl. .................. 324/754; 324/765
(58) Field of Classification Search ......... 324/754–765, 324/158.1; 385/137; 219/121.64; 439/482, 439/824
See application file for complete search history.

(56) References Cited

U.S. PATENT DOCUMENTS

| | | | | |
|---|---|---|---|---|
| 3,996,516 A | * | 12/1976 | Luther | 324/761 |
| 4,697,061 A | * | 9/1987 | Spaeter et al. | 319/121.64 |
| 5,272,310 A | * | 12/1993 | Daikuzono | 219/121.64 |
| 5,289,631 A | * | 3/1994 | Koopman et al. | 29/840 |
| 6,559,665 B1 | * | 5/2003 | Barabi | 324/755 |
| 6,573,702 B2 | * | 6/2003 | Marcuse et al. | 324/158.1 |
| 6,957,005 B2 | * | 10/2005 | Saulnier et al. | 385/137 |

FOREIGN PATENT DOCUMENTS

| | | |
|---|---|---|
| JP | 2002-164136 | 6/2002 |
| JP | 2002-228682 | 8/2002 |
| JP | 2002-257983 | 9/2002 |
| KR | 11-101840 | 4/1999 |
| KR | 2002-73820 | 9/2002 |

OTHER PUBLICATIONS

English language sbstract of Korean Publication No. 2002-73820.
English language abstract of Japanese Publication No. 2002-228682.
English language abstract of Japanese Publication No. 2002-257893.

* cited by examiner

*Primary Examiner*—Vinh P Nguyen
(74) *Attorney, Agent, or Firm*—Marger Johnson & McCollom, P.C.

(57) ABSTRACT

An apparatus includes a test board for testing electrical characteristics of the semiconductor chip; socket pins vertically disposed on the test board to electrically connect the test board, and external terminals of the semiconductor chip; socket springs interposed between the socket pins and the test board and making the socket pins vertically elastic; a plurality of laser beam transmitters vertically penetrating the socket pins, the socket springs, and the test board; and a laser beam source supplying laser beams to the laser beam transmitters.

18 Claims, 4 Drawing Sheets

APPARATUS AND METHOD FOR TESTING SEMICONDUCTOR CHIP

CROSS REFERENCE TO RELATED APPLICATIONS

This application claims priority from Korean Patent Application No. 10-2004-0103096, filed on 8 Dec. 2004 in the Korean Intellectual Property Office, the content of which is hereby incorporated by reference in its entirety for all purposes.

BACKGROUND

1. Technical Field

This disclosure relates to semiconductor devices, and more particularly, to an apparatus and method for testing the electrical characteristics of a semiconductor chip.

2. Description of the Related Art

After semiconductor chips are packaged, they are typically tested to determine whether defective chips exist. During this process, the electrical characteristics and reliability of the semiconductor chips are evaluated.

Depending on the results of the test, some of the semiconductor chips may be discarded or processed further. It is very important to reliably and precisely test semiconductor chips manufactured through a series of processes to determine whether the semiconductor chips are defective.

FIG. 1 is a sectional diagram illustrating a conventional apparatus 100 for testing a semiconductor chip 50. The scale of the various components of apparatus 100 may be exaggerated for clarity. The apparatus 100 includes a pressurization plate 120 disposed on the semiconductor chip 50, the pressurization plate 120 operable to weigh down the semiconductor chip such that a number of external terminals 55 for the semiconductor chip 50 are connected to a corresponding number of socket pins 110. Accordingly, the apparatus 100 may exchange electrical signals with the semiconductor chip 50 through the socket pins 110.

Socket springs 115 are interposed between the socket pins 110 and a test board 105 such that the socket pins 110 are vertically elastic. In other words, the socket springs 115 are compressed by the weight put on the semiconductor chip 50. Consequently, the external terminals 55 are maintained in physical contact with the socket pins 110.

The physical contact between the socket pins 110 and the external terminals 55 is usually reliable. However, that does not mean that the socket pins 110 always electrically contact the external terminals 55 without fail. Insulating foreign matter may be attached to surfaces of the external terminals 55 and the socket pins 110. Also, the surfaces of the external terminals 55 and the socket pins 110 may be oxidized. These residues may increase contact resistance when the socket pins 110 contact the external terminals 55.

If the apparatus 100 is repeatedly used, the contact resistance between the socket pins 110 and the external terminals 55 becomes very high, thereby causing test errors. In this case, the socket pins 110 must be washed or replaced by new socket pins. As semiconductor chips become faster and operating voltages of the semiconductor chips are lowered, the effects of contact resistance during a test process become increasingly greater.

Embodiments of the invention address these and other disadvantages of the conventional art.

SUMMARY OF THE INVENTION

According to some embodiments of the invention, an apparatus for testing a semiconductor chip may decrease contact resistance between socket pins and external terminals of the semiconductor chip. According to some other embodiments of the invention, a method of testing a semiconductor chip may decrease contact resistance between socket pins and external terminals of the semiconductor chip. Thus, embodiments of the invention enhance test reliability.

DETAILED DESCRIPTION

Figure 1:
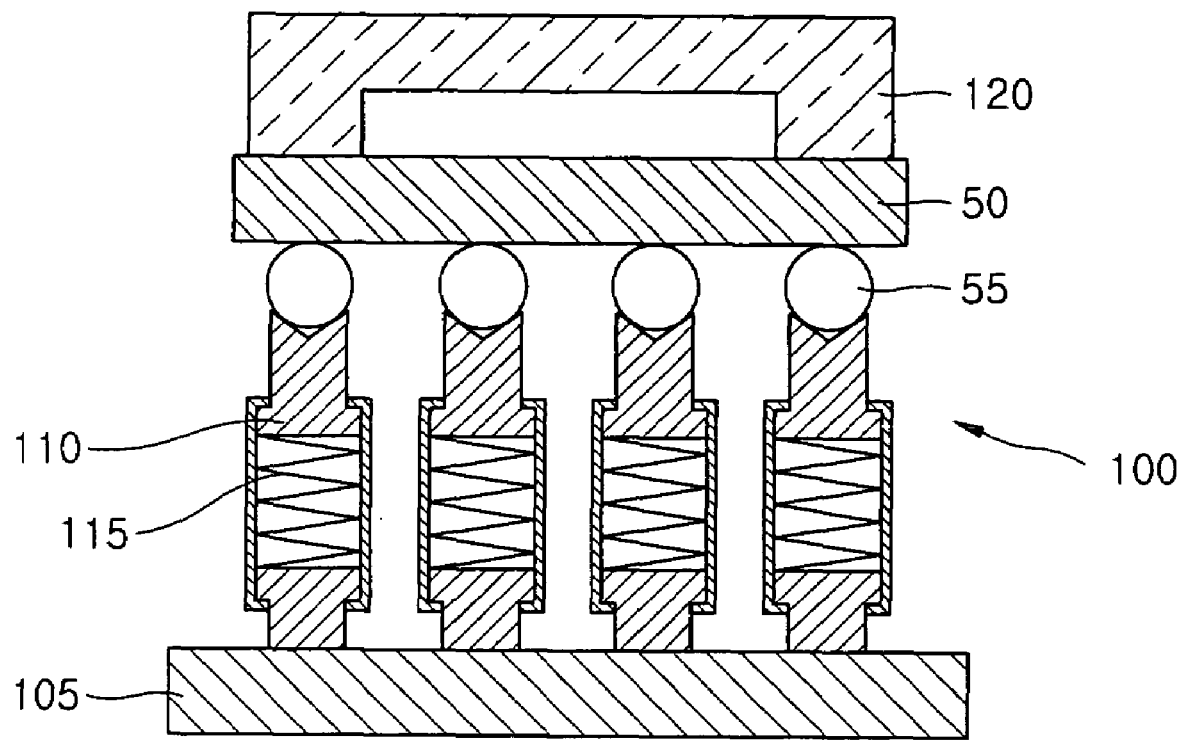
FIG. 1 is a sectional diagram illustrating a conventional apparatus for testing a semiconductor chip.

The invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. In the drawings, the thickness of layers and regions are exaggerated for clarity.

Figure 2:
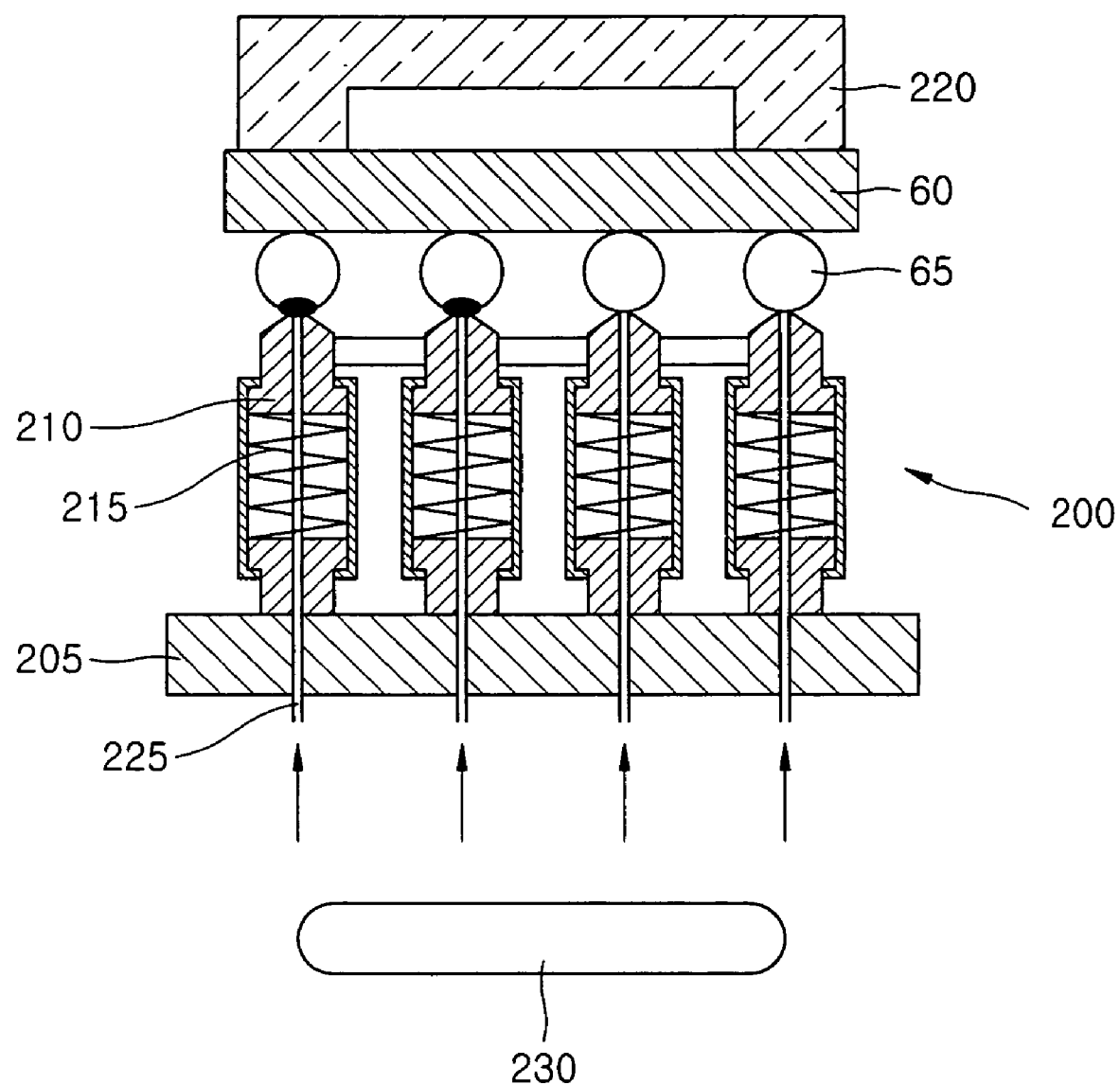
FIG. 2 is a sectional diagram illustrating an apparatus for testing a semiconductor chip according to some embodiments of the invention.

FIG. 2 is a sectional diagram illustrating an apparatus 200 for testing a semiconductor chip 60 according to some embodiments of the invention. Referring to FIG. 2, a test board 205 is electrically connected to external terminals 65 of the semiconductor chip 60 by socket pins 210. Accordingly, the apparatus 200 communicates electrical signals to the semiconductor chip 60 through the test board 205. Therefore, the apparatus 200 can, for example, test electrical characteristics of the semiconductor chip 60.

As illustrated in FIG. 2, the apparatus 200 further includes a pressurization plate 220 on a top surface of the semiconductor chip 60 that ensures that the external terminals 65 of the semiconductor chip 60 physically contact the socket pins 210.

Socket springs 215 are interposed between the socket pins 210 and the test board 205. Thus, the socket pins 210 are vertically elastic on the test board 205. In other words, when pressure is applied to the pressurization plate 220, the external terminals 65 weigh down the socket pins 210. Here, the socket pins 210 are made to contact the external terminals 65 by the vertical force supplied by the socket springs 215.

The apparatus 200 also includes laser beam transmitters 225 that vertically penetrate the socket pins 210, the socket springs 215, and the test board 205. The laser beam transmitters 225 may include, for example, optical fibers. A laser beam source 230 is disposed beneath the laser beam transmitters 225, the laser beam source configured to output light into the laser beam transmitters.

Hence, a laser beam emitted from the laser beam source 230 may be selectively output from upper tips of the socket pins 210 through the laser beam transmitters 225. If the external terminals 65 of the semiconductor chip 60 are in contact with the socket pins 210, the laser beam radiates closely on a bottom surface of the external terminals 65. In such a situation, the laser beam momentarily heats and melts the external terminals 65.

When the external terminals 65 are momentarily melted, the external terminals 65 become welded to the socket pins 210, securing the external terminals to the socket pins 210. Consequently, even though surfaces of the external terminals 65 may become oxidized, the oxidation layers on the surfaces of the external terminals 65 are melted and mixed. Thus, the surfaces of the external terminals 65 become conductive and clean again. In other words, when the oxidation layers of the external terminals 65 contact the socket pins 210, contact resistance between the external terminals 65 and the socket pins 210 does not increase. Therefore, the external terminals 65 electrically contact the socket pins 210 in a reliable manner.

In addition, even when foreign matter is attached to the surfaces of the external terminals 65 and the socket pins 210, the foreign matter is removed when the external terminals 65 are melted and welded to the socket pins 210. Accordingly, the foreign matter does not increase the contact resistance by preventing the external terminals 65 from contacting the socket pins 210.

Top surfaces of the socket pins 210, which contact the external terminals 65, may be shaped like probes. If the top surfaces of the socket pins 210 are shaped like probes, areas where the external terminals 65 are melted and welded to the socket pins 210 are reduced, thereby making it easy to connect or disconnect the external terminals 65 and the socket pins 210.

Figure 3:
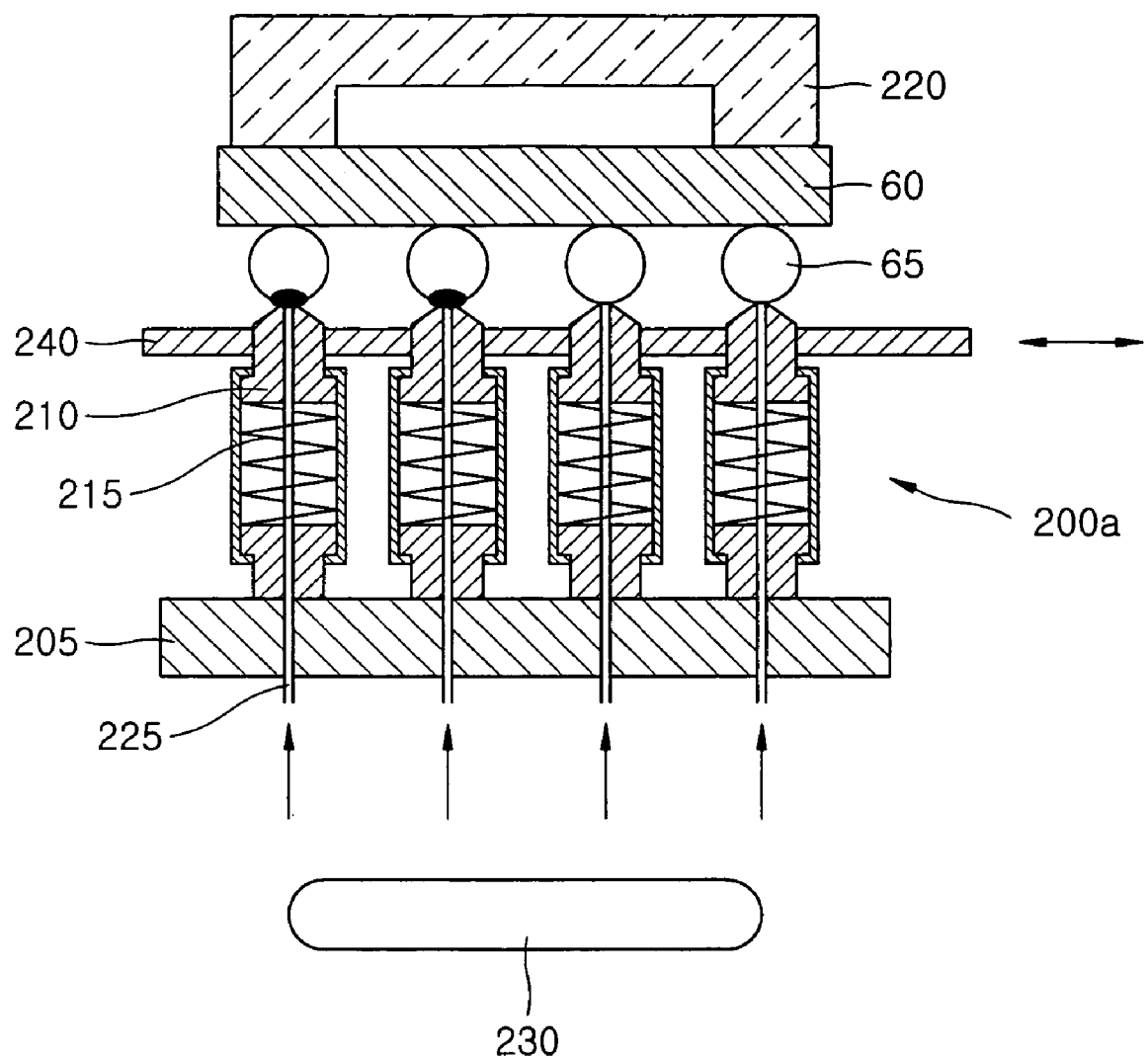
FIG. 3 is a sectional diagram illustrating an apparatus for testing a semiconductor chip according to other embodiments of the invention.

FIG. 3 is a sectional diagram illustrating an apparatus 200a for testing a semiconductor chip 60 according to other embodiments of the invention. Many elements of apparatus 200a are the same as those found in apparatus 200 illustrated in FIG. 2, and work in the same manner. Thus, like reference numerals in FIGS. 2 and 3 denote like elements, and another description of the elements found in the embodiments of FIG. 3 that are shared by the embodiments of FIG. 2 is not duplicated below. Rather, the differences between the embodiments of FIGS. 2 and 3 will be emphasized.

Unlike the apparatus 200 of FIG. 2, the apparatus 200a of FIG. 3 further includes an ultrasonic transmitting plate 240 that is structured to transmit vibrations to the socket pins 210. The ultrasonic transmitting plate 240 is parallel to the test board 205 and separated from it.

The ultrasonic transmitting plate 240 may be disposed such that the socket pins 210 vibrate parallel to the test board 205. Hence, when the ultrasonic transmitting plate 240 vibrates, the socket pins 210 also vibrate, thereby further securing the physical contact between the semiconductor chip 60 and external terminals 65.

Figure 4:
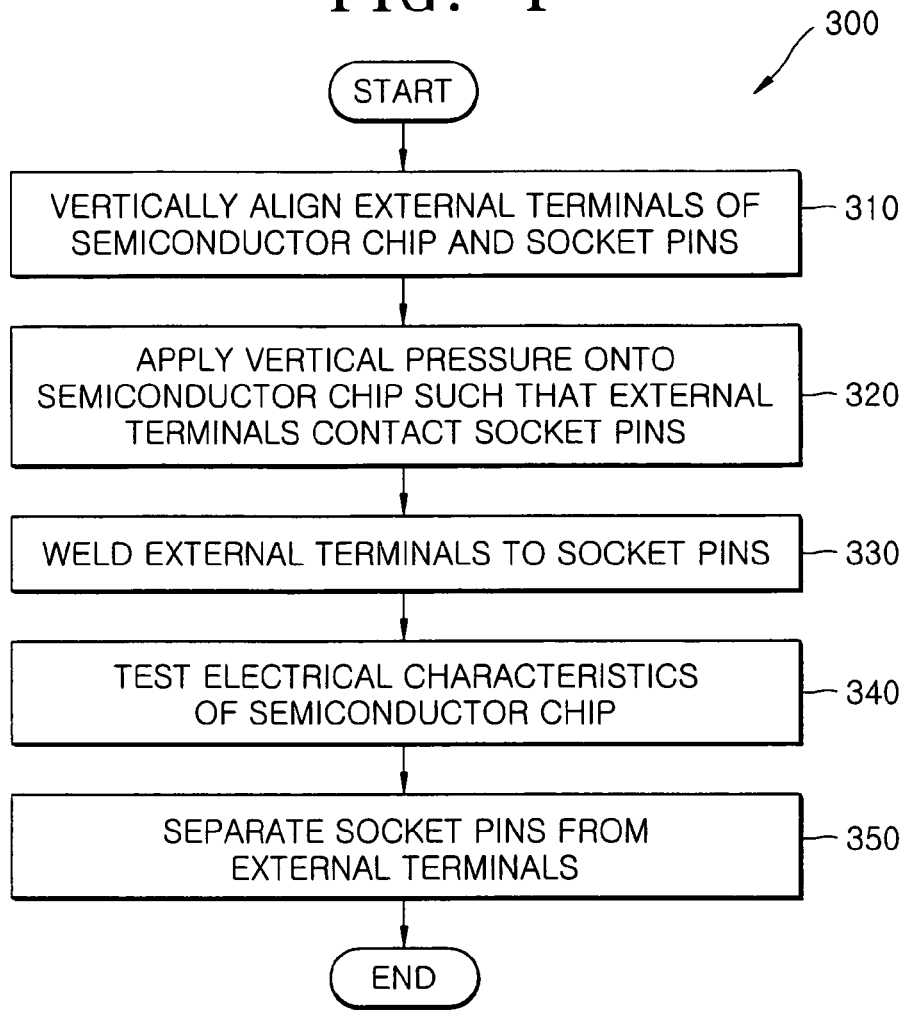
FIG. 4 is a flowchart illustrating exemplary processes used in a method for testing a semiconductor chip according to some other embodiments of the invention.

FIG. 4 is a flowchart illustrating exemplary processes used in a method 300 for testing a semiconductor chip according to some other embodiments of the invention. In the method 300 that is illustrated in FIG. 4, it is assumed that the apparatus 200 of FIG. 2 is being used in conjunction with the method. Therefore, the method 300 of FIG. 4 will now be described in detail below with reference to the apparatus 200 of FIG. 2.

In process 310, the external terminals 65 of the semiconductor chip 60 and the socket pins 210 are vertically aligned.

In process 320, pressure is applied vertically onto the semiconductor chip 60 such that the external terminals 65 contact the socket pins 210. Accordingly, the external terminals 65 physically contact the socket pins 210. The semiconductor chip 60 may be pressured by applying pressure downwards using the pressurization plate 220.

In process 330, the external terminals 65 are welded to the socket pins 210. Such a welding process may be performed by extracting a laser beam from the later beam source 230 and radiating the laser beam onto the external terminals 65 through the laser beam transmitters 225. Accordingly, the external terminals 65 are momentarily melted and, as the external terminals 65 are cooled, the external terminals 65 become welded to the socket pins 210.

Consequently, the physical contact between the external terminals 65 and the socket pins 210 is secured. Furthermore, since foreign matter or oxidation layers that may become attached to surfaces of the external terminals 65 and the socket pins 210 are removed or melted as the external terminals are welded to the socket pins, an electrical contact between the external terminals 65 and the socket pins 210 may be secured.

In process 340, the electrical characteristics of the semiconductor chip 60 are tested. The electrical characteristics of the semiconductor chip 60 can be tested by applying voltage or electric current to the test board 205 and transmitting the voltage or electric current to the external terminals 65 through the socket pins 210.

Figure 5:
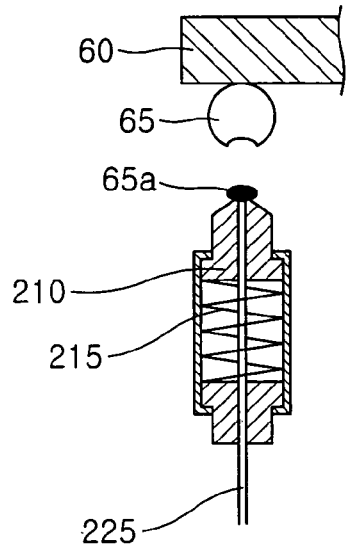
FIG. 5 is a sectional diagram of a portion of the apparatus of FIG. 2 that illustrates in further detail the process of separating socket pins from external terminals as described in FIG. 4.

FIG. 5 is a sectional diagram of a portion of the apparatus of FIG. 2 that illustrates in further detail the process of separating socket pins from external terminals as described in FIG. 4. In process 350, the socket pins 210 and the external terminals 65 are separated. Here, as illustrated in FIG. 5, the socket pins 210 and the external terminals 65 may be separated by pulling the semiconductor chip 60 and the attached external terminals away from the socket pins, causing the welded portions 65a of the external terminals to break away from the external terminal.

Alternatively, the external terminals 65 may once again be melted with the laser prior to pulling the semiconductor chip 60 away from the socket pins 210, causing the welded portions 65a to separate from the external terminal more easily. If this process is used, the external terminals 65 may be melted in the same manner as in the initial welding process (process 330). In other words, a laser beam emitted from the laser beam source 230 is transmitted to the welded portions 65a of the external terminals 65 and the socket pins 210 through the laser beam transmitters 225.

Referring to FIG. 5, after separation from the external terminals the welded portions 65a remain attached to the tips of the socket pins 210. However, this does not cause any problems because the welded portions 65a are again melted and welded to the surfaces of the external terminals 65 in a next test. Also, since the welded portions 65a are used repeatedly, the welded portions 65a do not become larger.

The invention may be practiced in many ways. What follows are exemplary, non-limiting descriptions of some embodiments of the invention.

According to some embodiments, an apparatus for testing a semiconductor chip includes a test board for testing electrical characteristics of the semiconductor chip, socket pins that are vertically disposed on the test board to electrically connect the test board, external terminals of the semiconductor chip, socket springs interposed between the socket pins and the test board and structured to make the socket pins vertically elastic, laser beam transmitters structured to vertically penetrate the socket pins, the socket springs, and the test board, and a laser beam source configured to supply laser beams to the laser beam transmitters.

The apparatus may further include a pressurization plate structured to apply pressure onto the semiconductor chip. In addition, the apparatus may further include an ultrasonic transmitting plate parallel to the test board and structured to transmit vibrations to the socket pins.

According to other embodiments, an apparatus for testing a semiconductor chip includes a test board for testing electrical characteristics of the semiconductor chip, socket pins disposed on the test board and configured to electrically connect the test board and external terminals of the semiconductor chip, laser beam transmitters configured to transmit laser beams to respective ends of the socket pins connected to the external terminals, and a laser beam source configured to supply the laser beams to the laser beam transmitters.

The laser beam transmitters may vertically penetrate the socket pins and the test board.

According to other embodiments of the invention, a method of testing a semiconductor chip includes contacting the external terminals of the semiconductor chip with the socket pins, welding the external terminals to the socket pins, testing the electrical characteristics of the semiconductor chip by supplying power to the test board, and separating the socket pins from the external terminals.

The welding of the external terminals to the socket pins may include melting the external terminals. Melting the external terminals may include extracting laser beams from the laser beam source and radiating the laser beams onto the external terminals using laser beam transmitters. Separating the socket pins from the external terminals may include applying physical force to the semiconductor chip.

While the invention has been particularly shown and described with reference to exemplary embodiments thereof, it will be understood by those of ordinary skill in the art that various changes in form and details may be made therein without departing from the spirit and scope of the invention as defined by the following claims.

The invention claimed is:

1. An apparatus comprising:
   a test board configured to test electrical characteristics of a semiconductor chip;
   socket pins vertically disposed on the test board and configured to electrically connect the test board to external terminals of the semiconductor chip;
   socket springs interposed between the socket pins and the test board, the socket springs configured to apply an elastic force vertically to the socket pins;
   laser beam transmitters that vertically penetrate the socket pins, the socket springs, and the test board; and
   a laser beam source configured to supply laser beams to the laser beam transmitters.

2. The apparatus of claim 1, the socket pins having probe-shaped ends.

3. The apparatus of claim 1, the laser beam transmitters comprising optical fibers wherein each socket pin and a corresponding socket spring are disposed encircling a corresponding one of the optical fibers.

4. The apparatus of claim 1, further comprising a pressurization plate configured to apply pressure onto the semiconductor chip.

5. The apparatus of claim 1, further comprising an ultrasonic transmitting plate disposed parallel to the test board and configured to transmit vibrations to the socket pins.

6. The apparatus of claim 5, the ultrasonic transmitting plate structured to vibrate parallel to the test board.

7. The apparatus of claim 1, wherein each socket pin includes one of the laser beam transmitters disposed at least in part within the socket pin.

8. The apparatus of claim 1, wherein each socket spring includes one of the laser beam transmitters disposed at least in part within the socket spring.

9. An apparatus comprising:
   a test board configured to test electrical characteristics of a semiconductor chip;
   socket pins disposed on the test board and configured to electrically connect the test board to external terminals of the semiconductor chip;
   laser beam transmitters configured to transmit laser beams through the socket pins to respective ends of the socket pins; and
   a laser beam source configured to supply the laser beams to the laser beam transmitters.

10. The apparatus of claim 9, the laser beam transmitters structured to vertically penetrate the socket pins and the test board.

11. The apparatus of claim 9, the laser beam transmitters comprising optical fibers, wherein each socket pin is disposed encircling a corresponding one of the optical fibers.

12. The apparatus of claim 9, further comprising an ultrasonic transmitting plate disposed in parallel to the test board and configured to transmit vibrations to the socket pins.

13. A method of testing a semiconductor chip comprising:
   contacting external terminals of the semiconductor chip with socket pins of a test board;
   welding the external terminals to the socket pins by irradiating the external terminals with laser beams through the socket pins;
   testing electrical characteristics of the semiconductor chip by supplying power to the test board; and
   separating the socket pins from the external terminals.

14. The method of claim 13, wherein contacting the external terminals comprises:
   vertically aligning the external terminals with the socket pins; and
   applying vertical pressure onto the semiconductor chip.

15. The method of claim 14, wherein applying vertical pressure comprises applying vertical pressure to a pressurization plate that is configured to contact the semiconductor chip.

16. The method of claim 13, wherein welding the external terminals to the socket pins comprises melting the external terminals.

17. The method of claim 13, wherein separating the socket pins from the external terminals comprises applying physical force to the semiconductor chip.

18. The method of claim 17, wherein separating the socket pins from the external terminals further comprises melting the external terminals before applying physical force to the semiconductor chip.

* * * * *

UNITED STATES PATENT AND TRADEMARK OFFICE
CERTIFICATE OF CORRECTION

| | |
|---|---|
| PATENT NO. | : 7,420,382 B2 |
| APPLICATION NO. | : 11/274703 |
| DATED | : September 2, 2008 |
| INVENTOR(S) | : Jun-Young Ko et al. |

It is certified that error appears in the above-identified patent and that said Letters Patent is hereby corrected as shown below:

On the Title Page, Item (57)
    In Foreign Patent Documents, reference "JP   2002-257983   9/2002" should read -- JP   2002-257893   9/2002 --;
    In Foreign Patent Documents, reference "KR   11-101840   4/1999" should read -- JP   11-101840   4/1999 --.

Signed and Sealed this

Eighteenth Day of November, 2008

JON W. DUDAS
*Director of the United States Patent and Trademark Office*